United States Patent
Mitros et al.

(10) Patent No.: US 6,803,282 B2
(45) Date of Patent: Oct. 12, 2004

(54) METHODS FOR FABRICATING LOW CHC DEGRADATION MOSFET TRANSISTORS

(75) Inventors: Jozef D. Mitros, Richardson, TX (US); James R. Todd, Plano, TX (US); Shanjen Pan, Plano, TX (US); Tsutomu Kubota, Inbagun Chiba (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/020,034

(22) Filed: Dec. 7, 2001

(65) Prior Publication Data

US 2003/0109089 A1 Jun. 12, 2003

(51) Int. Cl.$^7$ .......................................... H01L 21/8234
(52) U.S. Cl. ........................ 438/275; 438/276; 438/289
(58) Field of Search ................................. 438/275, 276, 438/289, 217, 199, 223, 224, 228, 229, 231, 232, 277

(56) References Cited

U.S. PATENT DOCUMENTS

| | | | |
|---|---|---|---|
| 5,075,242 A | * | 12/1991 | Nakahara |
| 5,648,288 A | | 7/1997 | Williams et al. |
| 5,726,477 A | | 3/1998 | Williams et al. |
| 6,143,594 A | * | 11/2000 | Tsao et al. |
| 6,165,852 A | * | 12/2000 | Chen et al. |
| 6,188,109 B1 | * | 2/2001 | Takahashi |
| 6,297,082 B1 | * | 10/2001 | Lin et al. |

* cited by examiner

*Primary Examiner*—Long Pham
(74) *Attorney, Agent, or Firm*—Wade James Brady, III; Frederick J. Telecky, Jr.

(57) ABSTRACT

Methods and apparatus are disclosed for fabricating thick and thin gate oxide transistors in a semiconductor device, wherein lightly doped source/drain regions for the thick gate oxide transistors are formed using a threshold voltage adjust implant, and lightly doped source/drain regions for the thin gate oxide transistors are formed using an LDD implant. The use of threshold voltage implantation to form the lightly doped source/drain regions for the thick gate oxide transistors allows lower dopant concentrations therein compared with the thin gate oxide transistors without the need for separate LDD implantation processing for transistors of different gate oxide thicknesses.

30 Claims, 11 Drawing Sheets

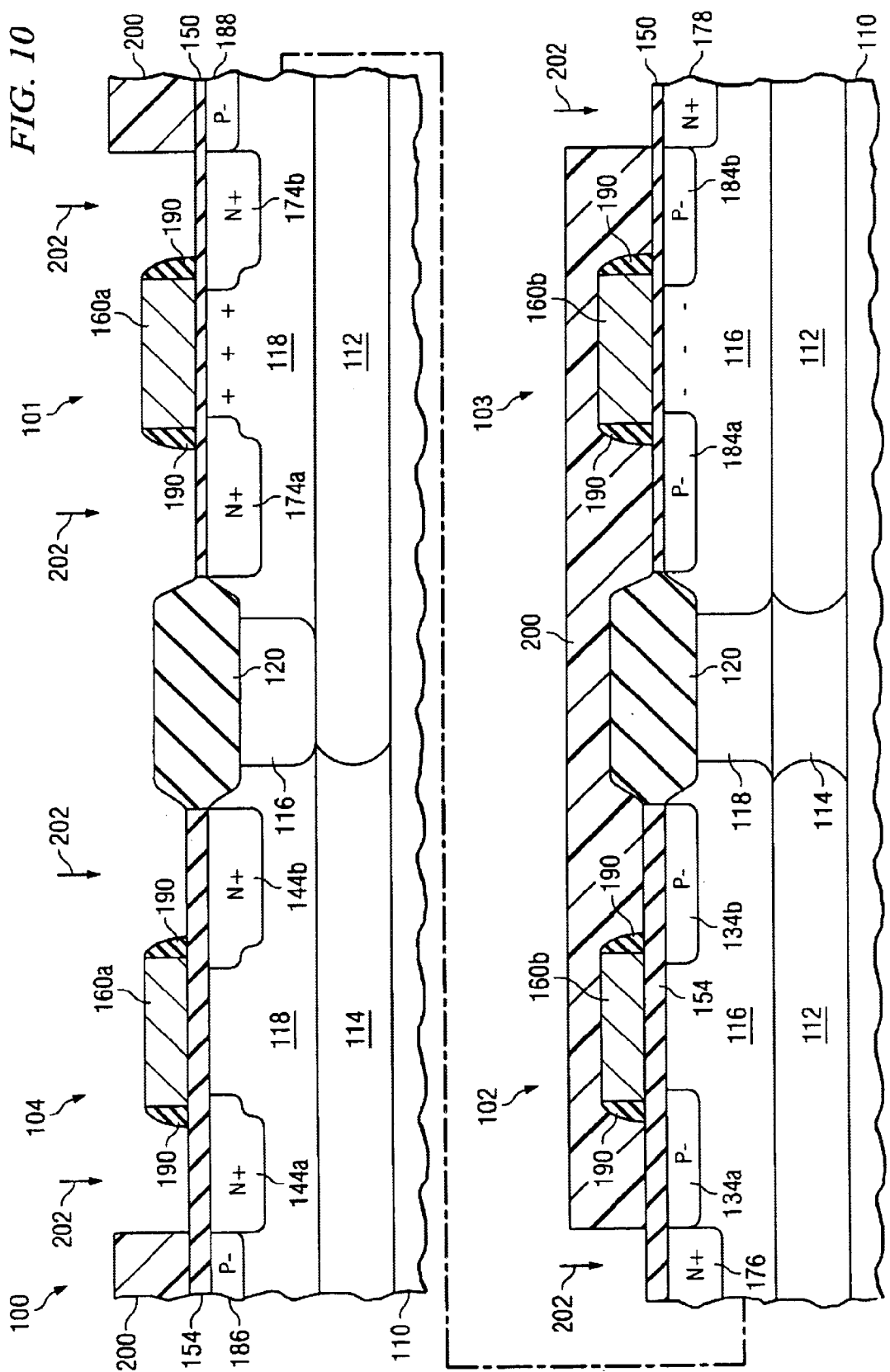

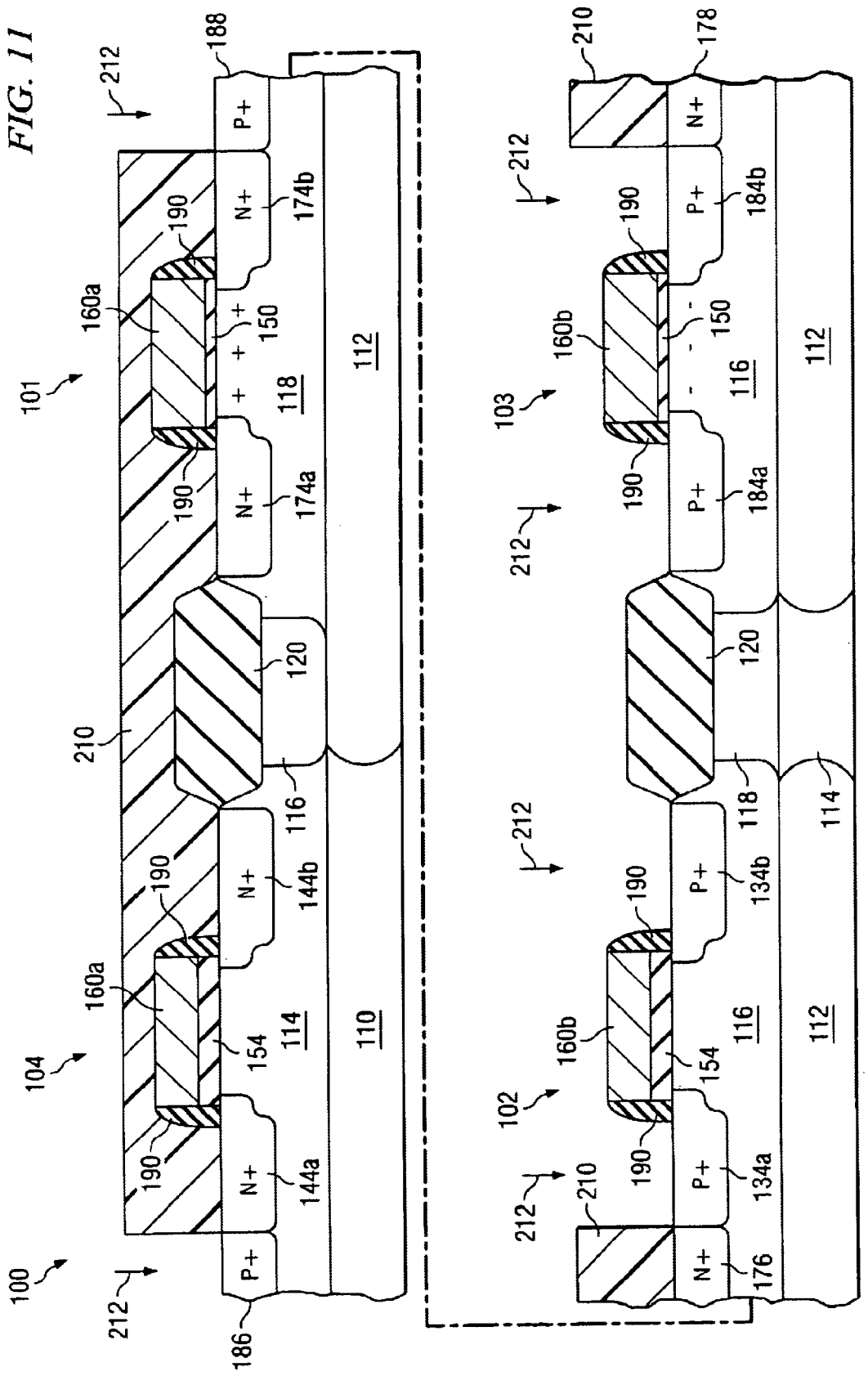

METHODS FOR FABRICATING LOW CHC DEGRADATION MOSFET TRANSISTORS

FIELD OF INVENTION

The present invention relates generally to semiconductor devices and more particularly to methods for fabricating transistors in a semiconductor device.

BACKGROUND OF THE INVENTION

MOSFETs and other types of transistors are found in many modern semiconductor products where switching and/or amplification functions are needed. Many manufacturing processes and techniques have been developed for forming MOSFET devices in semiconductor substrate materials such as silicon and the like. In recent years, the size of transistors and other components have steadily decreased to submicron levels in order to facilitate higher device densities in semiconductor products. At the same time, many applications of such devices have created a need to operate the semiconductor devices at lower power and voltage levels. For instance, many wireless communications devices and portable computer systems are operated from batteries. Thus, where previous MOSFET devices were designed to operate at voltages of 5 or more volts, newer applications may require such devices to operate from DC supplies of around 3 volts or less. Accordingly, efforts continue to be made to design semiconductor devices, such as MOSFET transistors, which consume less power and operate at lower voltages.

As the power supply voltages at which MOSFET transistors operate have been steadily decreased, the transistor operating specifications have changed as well. Thus, for example, decreasing the voltage at which a MOSFET transistor is to operate allows thinner gate oxide to be used in forming the MOSFET gate structure. In addition, the doping concentrations in the source/drain regions of the MOSFET have typically been increased to facilitate low power/low voltage operation. However, many applications continue to require transistors which operate at higher voltage levels, in addition to those devices designed to operate at low voltages. For example, semiconductor products are often required to interface with equipment such as printers, control systems, or the like, which generate signals at relatively high voltage levels, such as 12 volts DC.

In these situations, it is desirable to fabricate transistors designed for low power consumption and low voltage operation, as well as those designed for higher voltages, in a single semiconductor device or product. Accordingly, some MOSFETs in these products will have thin gate oxides (e.g., for the low voltage transistors), whereas others will have thicker gate oxides. Fabrication of such products is thus sometimes referred to as a split gate oxide process. In addition to formation of two or more gate oxide structures of different thicknesses, other processing considerations need to be accounted for in designing and producing such products. For instance, source/drain doping concentrations may need to be higher in the low voltage MOSFETs than in higher voltage transistors in order to achieve the desired operating parameters for both type devices. In this regard, it is noted that the formation of low voltage MOSFET device source/drain regions already includes two separate processing steps (e.g., implantations) in situations where both P type and N type MOSFET transistors are needed. Although separate source/drain formation steps (e.g., such as separate implantation processes) may be used to provide appropriate doping concentrations for the low voltage and higher voltage MOSFET source/drain regions, the extra processing steps increase the product cost, and may render such an approach commercially uncompetitive.

Thus, it is desirable, where possible, to reduce the number and complexity of extra processing steps required to form both low voltage and higher voltage MOSFET devices in a single semiconductor product. One possibility is to apply the same source/drain implantation process to both the high voltage and the low voltage MOSFET devices, for each type (e.g., N and P). For instance, a lightly doped drain (LDD) implantation process optimized to implant phosphorus or arsenic in source/drain regions of low voltage (e.g., 3 volt) NMOS devices can also be used to implant higher voltage (e.g., 7 volt) NMOS source/drain regions, thereby reducing the number of processing steps. Similarly, an LDD implantation of boron in the source/drain regions of low voltage (e.g., 3 volt) PMOS devices can also be used to implant higher voltage (e.g., 7 volt) PMOS transistor source/drain regions.

However, it has been found that employing such implantation processes for both low and high voltage MOSFET devices results in high substrate currents and channel hot carrier degradation (CHC) in the high voltage devices where the implant is optimized for the low voltage MOSFETs, which in turn may lead to performance degradation and/or device damage. For instance, where source/drain regions of the high voltage NMOS devices are implanted using a high dosage implant optimized for the low voltage MOSFETS, high substrate current may cause injection of hot electron carriers into the gate oxide above the silicon substrate. In this regard, it has been found that the higher dopant concentration, combined with the higher operating voltages, cause higher than desired electric fields, which in turn cause hot carrier generation. The injected hot carriers, in turn, often lead to undesired degradation of MOSFET device operating parameters, such as a shift in threshold voltage, changed transconductance, changed drive current/drain current exchange, and device instability. In particular, the LDD dose used to form the low voltage MOSFET device source/drain regions (e.g., for the devices having the thinner gate oxide) is typically too high for the high voltage devices (e.g., having thicker gate oxide) to ensure low substrate current and acceptable hot carrier degradation. Thus, there is a need for improved manufacturing methodologies for fabricating both low and high voltage MOSFET devices in a semiconductor product, by which substrate current and CHC degradation can be controlled, without adversely increasing the number of processing steps.

SUMMARY OF THE INVENTION

The following presents a simplified summary in order to provide a basic understanding of one or more aspects of the invention. This summary is not an extensive overview of the invention. It is intended neither to identify key or critical elements of the invention nor to delineate the scope thereof. Rather, the primary purpose of the summary is to present some concepts of the invention in a simplified form as a prelude to the more detailed description that is presented later.

The invention relates to semiconductor device fabrication, wherein source/drain regions in one transistor are implanted using a threshold voltage (VT) adjust implantation, which is concurrently also being used to adjust the threshold voltage of another transistor. Using this technique, the source/drain regions of high voltage MOSFET devices can be implanted while adjusting the threshold voltage of lower voltage MOSFETS. Thus, the somewhat lower dosage implant can simultaneously or contemporaneously be used to implant the channel (e.g., or indeed the entire active area) associated with a low voltage device, along with the source/drain regions of a higher voltage device, for example, using appropriate VT adjust implantation masking. The high voltage device source/drain regions can then be masked from subsequent LDD implantation of the low voltage device source/drain regions. As a result, the appropriate dopant concentrations are achieved in both the high and low voltages devices, without adding extra processing steps, such as separate LDD implants for each type device. Thus, the invention can be advantageously employed in split gate oxide device processing to control CHC degradation without adversely impacting product cost.

One aspect of the invention relates to a method of fabricating MOSFET transistors in a semiconductor device, which involves implanting a first transistor region associated with a first transistor device in the semiconductor device using a first implantation process to adjust a threshold voltage associated with the first transistor device, and implanting a portion of a second transistor region associated with a second transistor to form a source/drain region associated with the second transistor using the first implantation process. The first implantation process, for example, may be a threshold voltage (VT) adjust implant optimized for adjusting threshold voltages associated with low voltage MOSFET transistors in the device. A first gate oxide structure may be formed overlying a channel region in the first transistor region, and a second gate oxide structure is formed overlying a channel region in the second transistor region, where the second gate oxide structure is thicker than the first gate oxide structure. Source/drain regions for the first transistor can then be formed by implanting a portion of the first transistor region using a second implantation process, such as an LDD implant optimized for low voltage device source/drain formation.

In one implementation, for example, the first implant may employ boron to adjust the threshold voltages of low voltage (e.g., 3 volt) NMOS transistors, as well as to form the source/drain regions of high voltage (e.g., 7 volt) PMOS devices. Where both NMOS and PMOS devices (e.g., high and low voltage) are needed in a particular semiconductor product, similar processing using arsenic or phosphorus may be employed for VT adjust of low voltage PMOS devices and source/drain formation for high voltage NMOS devices. In such a case, the methodology may further comprise implanting a third transistor region associated with a third transistor device in the semiconductor device using a third implantation process to adjust a threshold voltage associated with the third transistor device, and implanting a portion of a fourth transistor region associated with a fourth transistor to form a source/drain region associated with the fourth transistor using the third implantation process. The source/drain regions of the third transistor may then be formed using a fourth implantation process, such as an LDD implant optimized for low voltage MOSFET devices.

Another aspect of the present invention involves a method of forming a source/drain region in a semiconductor device, comprising selectively implanting a first transistor region to adjust a threshold voltage associated with a first transistor device and a portion of a second transistor region to form a source/drain region associated with a second transistor device using a single implantation process. The invention further comprises methods for fabricating MOSFET transistors in a semiconductor device, comprising adjusting a threshold voltage of a first transistor device using a first threshold adjust implantation process, and forming a source/drain region of a second transistor device using the first threshold adjust implantation process.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 10 is a partial side elevation view in section illustrating implantation of source/drain regions of low and high voltage NMOS devices using a phosphorus or arsenic implantation process in the semiconductor device of FIGS. 2–9; and FIG. 11 is a partial side elevation view in section illustrating implantation of source/drain regions of low and high voltage PMOS devices using a boron implantation process in the semiconductor device of FIGS. 2–10.

DETAILED DESCRIPTION OF THE INVENTION

Figure 1:
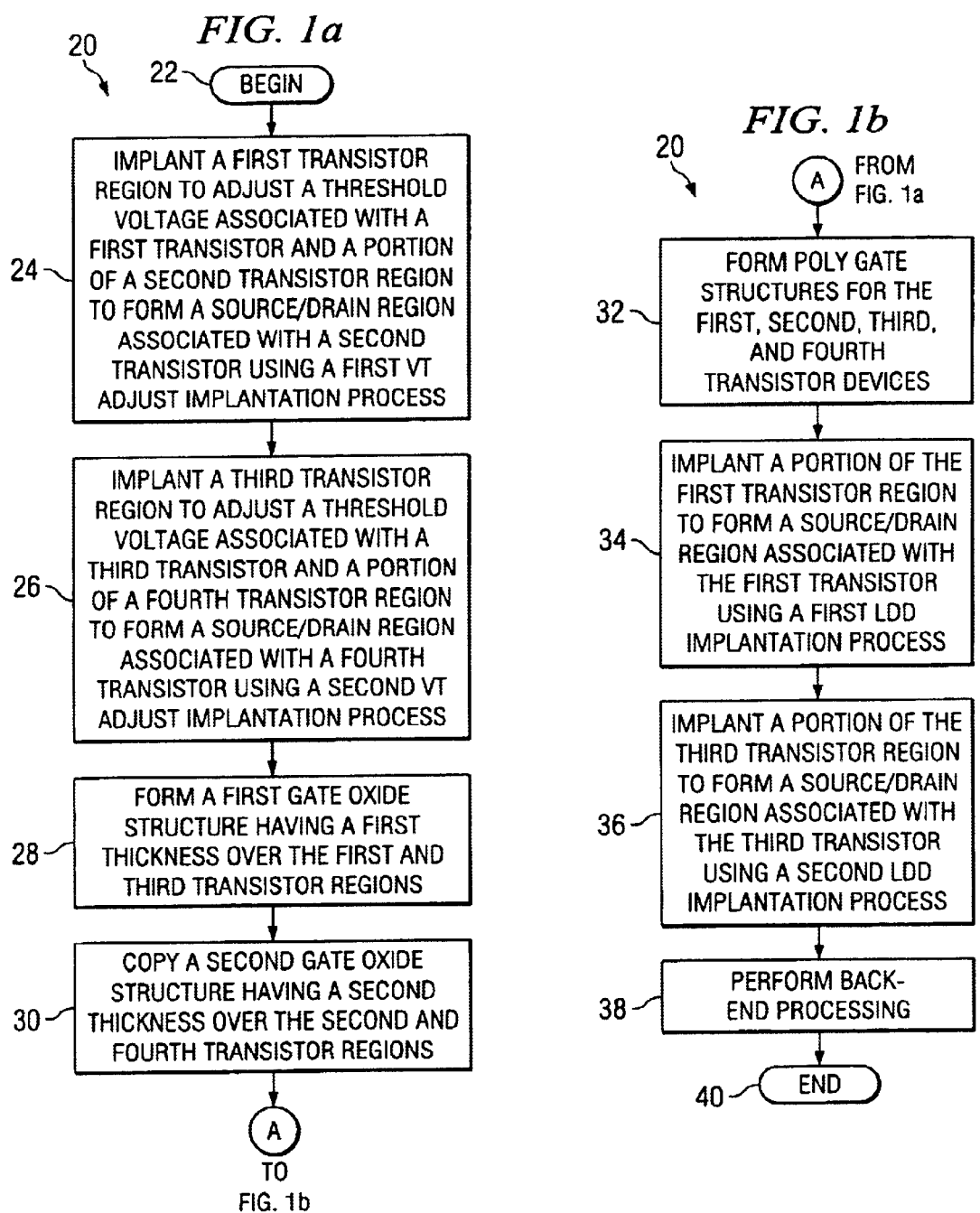
FIGS. 1a and 1b are flow diagrams illustrating an exemplary method of fabricating MOSFET transistors in accordance with the present invention.

The present invention will now be described with reference to the attached drawings, wherein like reference numerals are used to refer to like elements throughout. The invention relates to the manufacture of semiconductor devices in which a single implantation process step is employed to implant one or more source/drain regions of a first device, while adjusting the threshold voltage of another device. While illustrated and described hereinafter in the context of split-gate oxide processing to form both high and low voltage MOSFET transistors in a semiconductor device or product, the invention finds utility in association with other types of semiconductor devices, and such other applications are contemplated as falling within the scope of the appended claims. The invention can be employed to provide appropriate source/drain region doping concentrations in products having both thick oxide and thin oxide MOSFET transistors without requiring separate or dedicated source/drain implants for each of these types of devices. In one implementation, the invention advantageously employs a VT adjust implantation to both adjust the threshold voltage of a first transistor, and to implant or form one or more source/drain regions associated with a second transistor.

An aspect of the invention relates to methods for fabricating MOSFET or other transistors in a semiconductor device. One such method 20 is illustrated and described hereinafter with respect to FIGS. 1a and 1b. Although the exemplary method 20 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in the fabrication of the semiconductor devices illustrated and described herein as well as in producing other devices not illustrated or described.

Beginning at 22 in FIG. 1a, the method 20 comprises implanting a first transistor region in the semiconductor device at 24 to adjust a threshold voltage associated with the first transistor as well as a portion of a second transistor region to form a source/drain region of a second transistor using the first implantation process, such as a first VT adjust implant. The VT implant may be refined or optimized for performing the threshold voltage adjustment of the first transistor, and is further operable to form the source/drain region(s) for the second transistor. Thus, the first VT adjust implantation at 24 serves a dual-function, by which extra processing steps normally associated with split-gate oxide type devices may be reduced. For example, in the exemplary implementation illustrated and described hereinafter with respect to FIGS. 2–11, the first VT implant employs boron to contemporaneously adjust the threshold voltage of a low voltage NMOS transistor and to form source/drain regions in a higher voltage (e.g., thicker gate oxide) PMOS transistor, by which a subsequent (e.g., dedicated) LDD implant for the high voltage PMOS source/drain regions is not needed.

At 26, a second VT adjust implantation process is employed to implant a third transistor region in the semiconductor device using a third implantation process in order to adjust a threshold voltage associated with a third transistor as well as a portion of a fourth transistor region to form a source/drain region of a fourth transistor. For instance, where both PMOS and NMOS type high and low voltage (e.g., thick and thin gate oxide) transistors are to be fabricated in a semiconductor device, the second VT adjust implant at 26 may be used to implant phosphorus or arsenic in the third transistor region and a portion of a fourth transistor region, where the third transistor is a low voltage (e.g., thin gate oxide) PMOS transistor and the fourth transistor device is a high voltage NMOS device. Thereafter at 28, a first gate oxide structure is formed having a first thickness overlying the first and third (e.g., low voltage) transistor regions and a second gate oxide structure is formed at 30, having a second thickness overlying the second and fourth transistor regions. Any desired first and second gate oxide thicknesses may be used at 28 and 30, for example, such as where the first thickness is about 65 Å or more and the second thickness is about 300 Å or less. For instance, in the implementation below of FIGS. 2–11, the first oxide thickness is about 75 Å and the second thickness is about 200 Å.

Referring also to FIG. 1b, the method 20 continues at 32 where polysilicon gate structures are formed for the transistor devices. At 34, a portion of the first transistor region is implanted to form one or more source/drain regions for the first transistor, and at 36, a portion of the third transistor region is implanted to form one or more source/drain regions for the third transistor. The implants at 34 and 36 may be performed, for example, using LDD implants where the implant at 34 uses phosphorus or arsenic to form source/drain regions in a thin gate oxide (e.g., low voltage) NMOS transistor and the second LDD implant at 36 uses boron to form source/drain regions for thin gate oxide PMOS transistors. At 38, other back-end processing is performed to complete fabrication of the transistors and other devices in the semiconductor device, for example, such as further implants to refine transistor device structures, formation of overlying insulation and metal connection layers, and the like, as are known, before the method 20 ends at 40.

Figure 2:
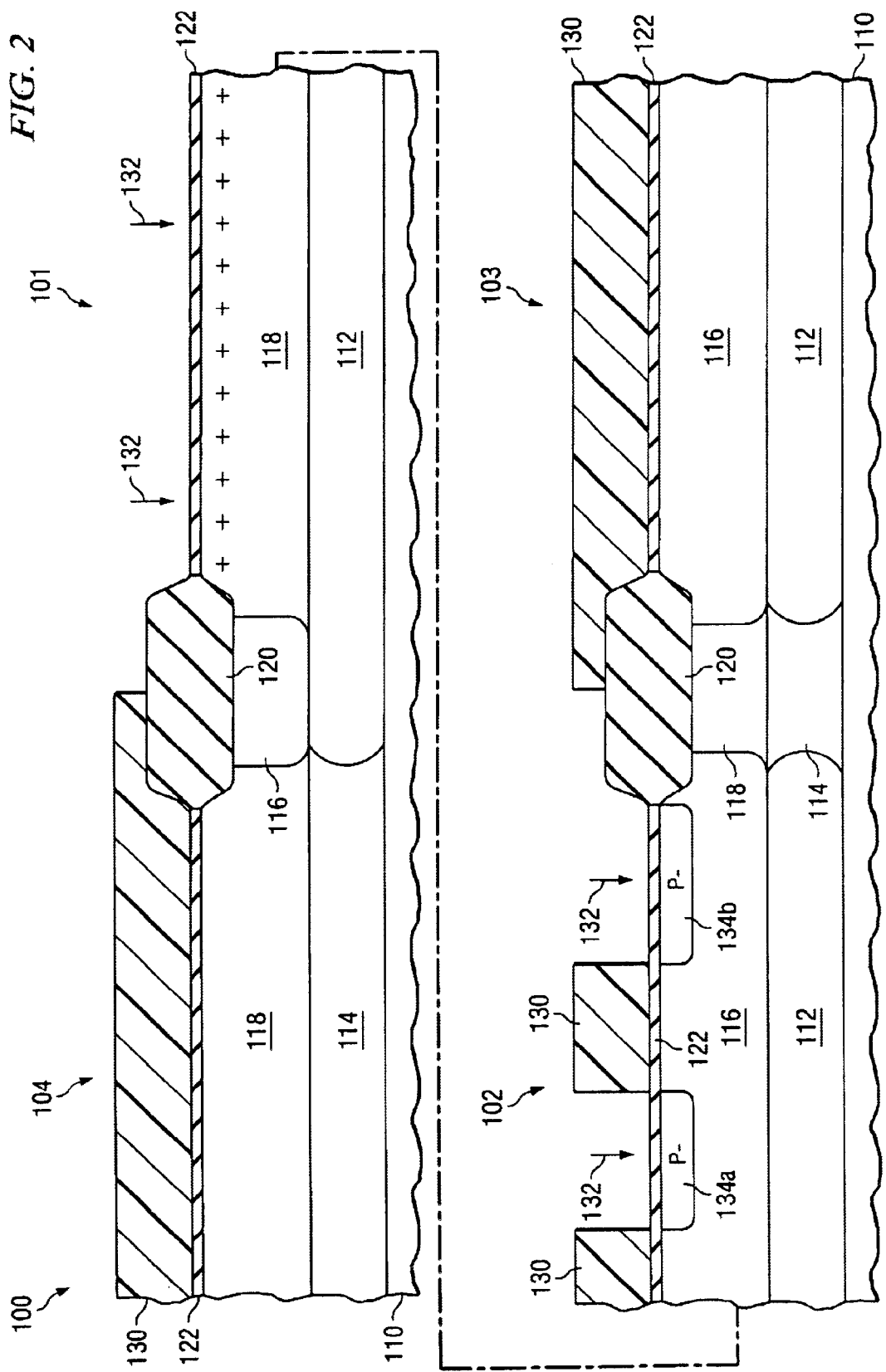
FIG. 2 is a partial side elevation view in section illustrating simultaneous implantation of an active region of a low voltage NMOS device and source/drain regions of a high voltage PMOS device using a boron threshold voltage adjust implantation process in fabricating a semiconductor device according to the invention.

Referring now to FIGS. 2–11, an exemplary implementation of the present invention is illustrated with respect to a portion of a semiconductor device or product 100. As shown in FIG. 2, the illustrated portions of the semiconductor device 100 comprise first, second, third, and fourth active or transistor regions 101, 102, 103, and 104, respectively, in which MOSFET transistor devices are fabricated in a substrate 110 as illustrated and described below. Although illustrated in FIGS. 2–11 as being somewhat contiguous with one another, the invention is not limited to the illustrated relative positions of the transistor regions 101–104, and it will be appreciated that any appropriate location of the various transistors and other devices in a semiconductor can be employed in accordance with the invention. In addition, other components or devices, such as resistors, capacitors, or the like (not shown) may also be fabricated in the device 100.

The device 100 is formed from a substrate 110 doped with acceptors by which the substrate 110 is P type. The substrate 110 may alternatively comprise a P$^-$ epitaxial layer (not shown). A buried N type layer 112 and a buried P type layer 114 are implanted in the substrate 110, for example, using deep implant diffusion under film techniques as are known. Further implantations into the substrate 110 provide N wells 116 and P wells 118, for example, using phosphorus implanted at a dose of about 1 E13 cm$^{-2}$ and an energy of about 150 keV, and boron implanted at a dose of about 1 E13 cm$^2$ and an energy of about 50 keV, respectively. In order to define the active transistor regions 101–104 and to provide isolation therebetween, field oxide regions 120 are formed, for example, using local oxidation of silicon (LOCOS), and a dummy gate oxide 122 is formed over the transistor regions 101–104, such as using SiO2.

In FIG. 2, a VTN implantation mask 130 is patterned (e.g., using deposition of photoresist and appropriate lithography techniques as are known) so as to selectively expose at least a channel portion of the first transistor region 101, as well as source/drain regions in the second transistor region 102. A first threshold voltage (VTN) adjust implantation process 132 is employed to implant boron in the first transistor region 101 and the exposed (e.g., source/drain) portions of the second transistor region 102 using the mask 130. The process 132 provides P type dopant to the channel region of the first transistor region 101 near the upper surface of the P well 118 to thereby adjust the threshold voltage of a first transistor formed therein, as further illustrated and described below. The implantation 132, moreover, provides such P type dopants to the second transistor region 102 by which P⁻ type source/drain regions 134*a* and 134*b* are formed in the N well 116 under the dummy gate oxide 122.

The first VT adjust implantation 132 may comprise one or more implants using boron. For instance, the implant 132 may comprise performing a boron threshold adjustment implantation using a dose of about 3 E12 $cm^{-2}$ and an energy of about 20 keV, and performing a boron punch-through implantation having a dose of about 4 E12 $cm^{-2}$ and an energy of about 70 keV using the mask 130. It is noted at this point that the implantation process 132 serves a dual function of adjusting the threshold voltage for a first transistor (e.g., an NMOS device) to be formed thereafter in the first transistor region 101, as well as to form the source/drain regions 134 in the second transistor region 102, as part of a second transistor device (e.g., PMOS) to be formed therein.

As will be appreciated, the dual functionality of the first VT adjust implant 132 thus allows or facilitates reduction in the amount of processing required to form such MOSFET devices in the semiconductor device 100. In this regard, source/drain regions can be later formed using LDD implantation in portions of the first transistor region 101, as illustrated and described further below with respect to FIG. 7. Moreover, it is noted that the implant 132 provides appropriate dopant concentration in the source/drain regions 134 so as to avoid or mitigate excessive substrate currents and channel hot carrier degradation in a high voltage (e.g., PMOS) transistor formed in the region 102.

Figure 3:
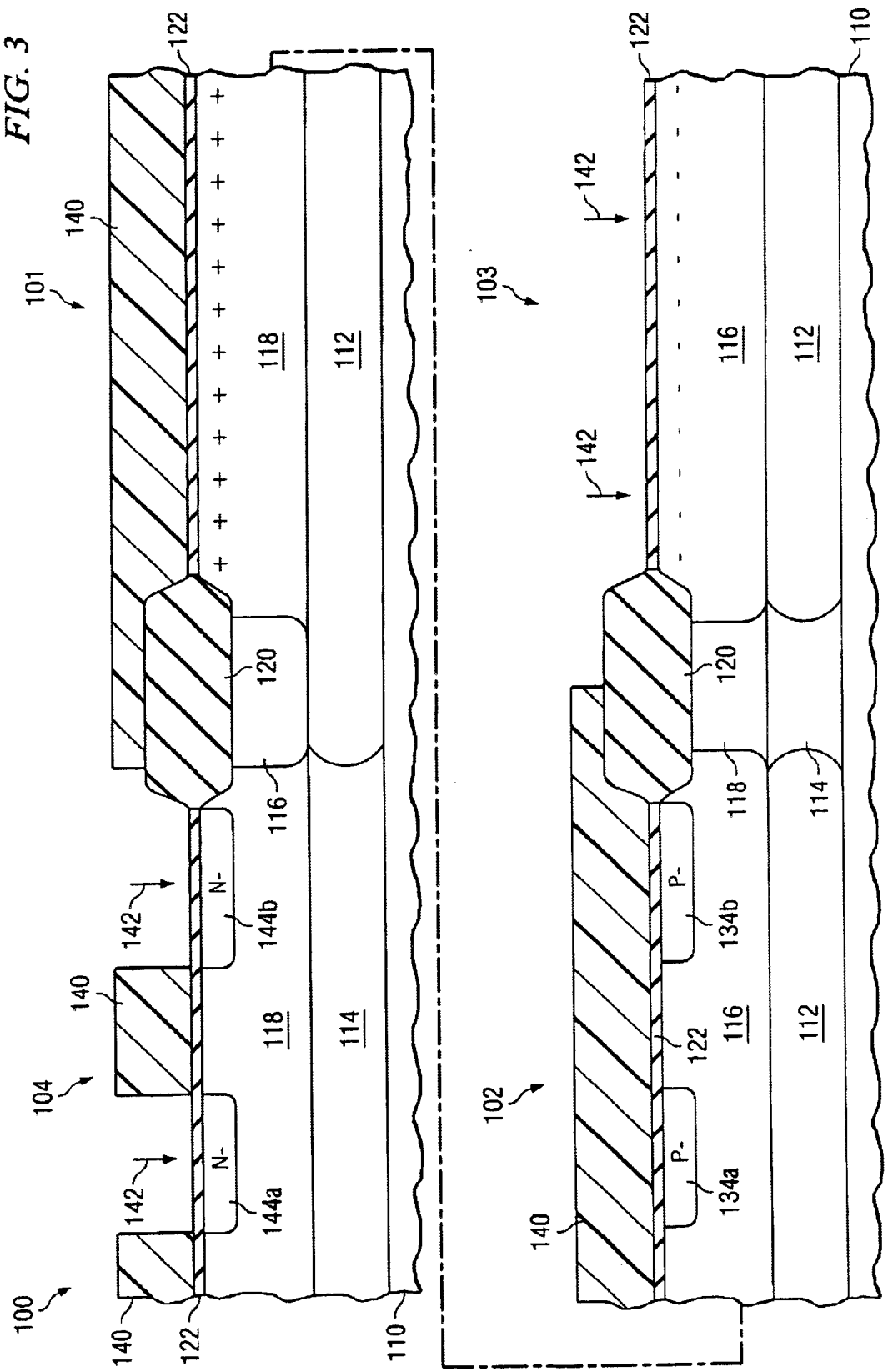
FIG. 3 is a partial side elevation view in section illustrating simultaneous implantation of an active region of a low voltage PMOS device and source/drain regions of a high voltage NMOS device using a phosphorus threshold voltage adjust implantation process in the semiconductor device of FIG. 2.

Turning now to FIG. 3, the VTN mask 130 is removed and a VTP implantation mask 140 is patterned, for example, from deposited photoresist, which selectively exposes at least a channel portion of the third transistor region 103, and source/drain portions of the fourth transistor region 104. A second threshold voltage (VTP) adjust implantation process 142 is then used to implant phosphorus in the third transistor region 103 and portions of the fourth transistor region 104 using the mask 140. The process 142 thus implants N type dopant to the channel region of the third transistor region 103 near the upper surface of the N well 116 to adjust the threshold voltage of a third (e.g., PMOS) transistor formed therein as illustrated below. In addition, the implant 142 serves to provide N type dopants to the fourth transistor region 104 to form N⁻ type source/drain regions 144*a* and 144*b* in the P well 118. As with the VTN process 132, the VTP implant 142 of FIG. 3 may comprise one or more phosphorus implants. In the implementation of FIG. 3, for example, the implant 142 involves performing a phosphorus threshold adjustment implantation through the exposed portions of the mask 140 using a dose of about 8 E11 $cm^{-2}$ and an energy of about 20 keV, and then performing a phosphorus punch-through implantation using a dose of about 2 E12 $cm^{-2}$ and an energy of about 70 keV.

It will be appreciated that any appropriate implantation species, dosages, and/or energies can be used in the processes 132 and 142, and that the illustrated implementation is but one example of dual-purpose implantations performed with appropriate masking so as to contemporaneously adjust the threshold voltage of one transistor while forming one or more source/drain regions associated with another transistor. For instance, in FIG. 3, the implantation process 142 serves a dual function of adjusting the threshold voltage for a third transistor (e.g., a PMOS device) to be formed thereafter in the third transistor region 103, as well as to form the source/drain regions 144 in the fourth transistor region 104, as part of a fourth (e.g., NMOS) transistor device to be formed therein.

With respect to the third transistor region 103, source/drain regions can be later formed therein using an LDD implantation in portions thereof, as described further below with respect to FIG. 8. Having adjusted the threshold voltages of the first and third transistor regions 101 and 103, and having formed the source/drain portions of the second and fourth transistor regions 102, and 104, the dummy gate oxide 122 is then removed by any appropriate process, for example, such as via etching using hydrofluoric acid (not shown).

Figure 4:
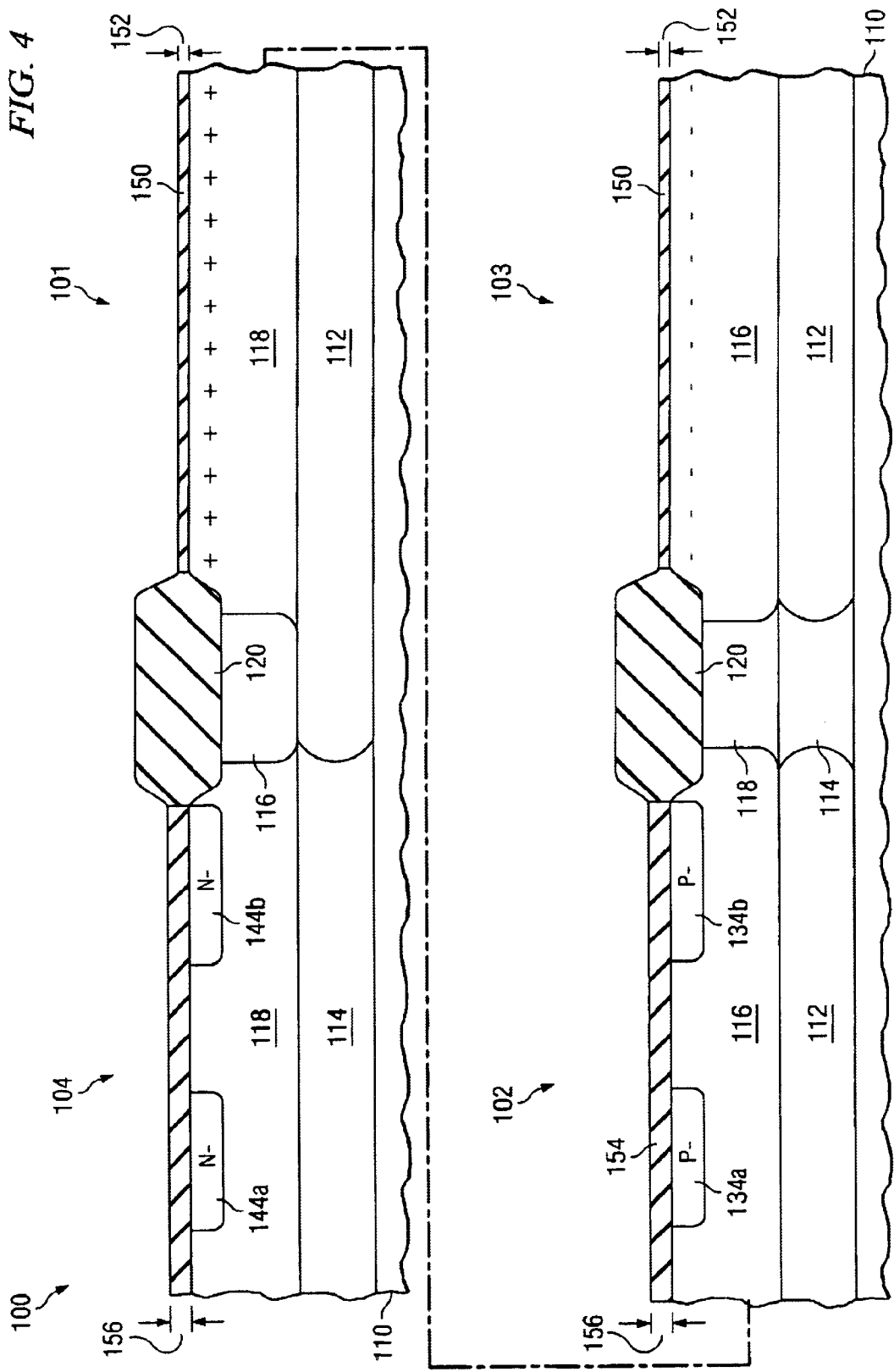
FIG. 4 is a partial side elevation view in section illustrating formation of first and second gate oxide layers having different thicknesses in the semiconductor device of FIGS. 2 and 3.

Referring now to FIG. 4, a first gate oxide structure 150 is selectively formed over the first and third transistor regions 101 and 103, having a first thickness 152, where the structure 150 comprises $SiO_2$. A second gate oxide structure 154 is then formed over the second and fourth transistor regions 102 and 104, respectively, with a second thickness 156. In the implementation of FIGS. 2–11, the first thickness 152 is less than the second thickness 156, where first and third transistors (e.g., NMOS and PMOS) in the regions 101 and 103, respectively, will be fabricated for relatively low voltage (e.g., 3 volt) operation.

Conversely, second and fourth transistors (e.g., PMOS and NMOS) will be fabricated in the regions 102 and 104, respectively, for higher voltage (e.g., 7 volt) operation. In the illustrated device 100, the low voltage MOSFET transistors in regions 101 and 103 will have a relatively thin gate oxide 150 of thickness 152 of about 65 Å or more, for example, about 75 Å, and will have source/drain regions doped with relatively high dopant concentrations, as illustrated and described further hereinafter with respect to FIGS. 7 and 8. The source/drain regions 134 and 144 for the higher voltage devices in regions 102 and 104, respectively, have relatively lower dosage levels (e.g., provided in the VT adjust implants 132 and 142 above), and have thicker gate oxide thicknesses 156 of about 300 Å or less, for example, about 200 Å in the illustrated implementation.

It is noted that if the source/drain regions 134 and 144 in regions 102 and 104 were to be implanted with the higher dopant concentrations used for the lower voltage devices, high substrate currents and channel hot carrier degradation problems may arise. Alternatively, separate (e.g., lower dosage) source/drain implantations could be performed. However, this results in increased processing steps to accommodate the inclusion of both high and low voltage MOSFET devices in the semiconductor product 100. Thus, it will be noted that the employment of the VT adjust implants 132 and 142 above (FIGS. 2 and 3, respectively) to both adjust threshold voltages for the low voltage devices (e.g., in regions 101 and 103), and to form the source/drain regions 134 and 144 in regions 102 and 104 advantageously provides the appropriate dopant concentrations therein, without adding extra processing steps. As a result, the invention allows streamlining of split gate oxide processing wherein both high and low voltage MOSFETs are used.

Figure 5:
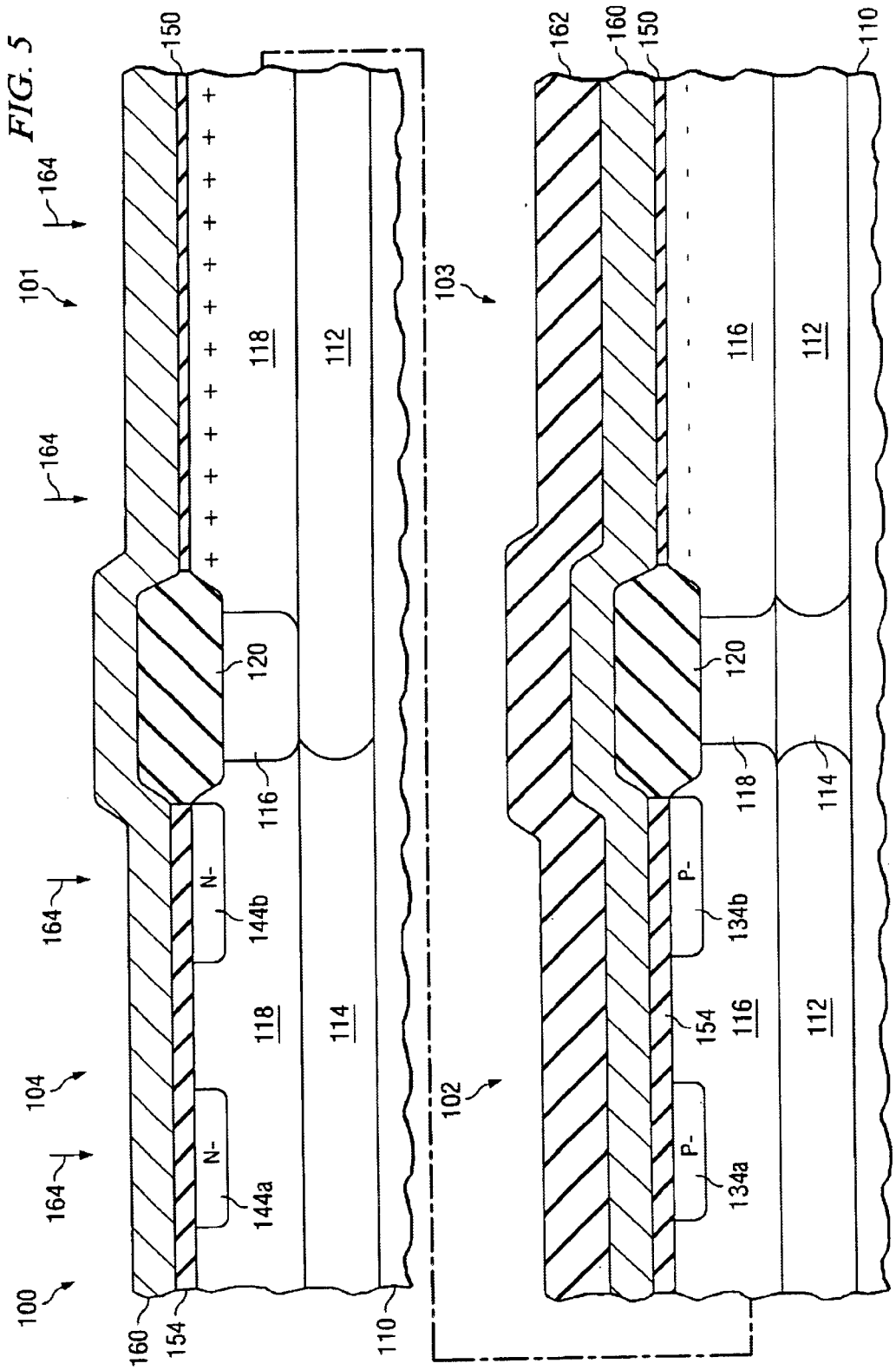
FIGS. 5 and 6 are partial side elevation views in section illustrating formation of polysilicon gate structures in the semiconductor device of FIGS. 2–4.
Figure 6:
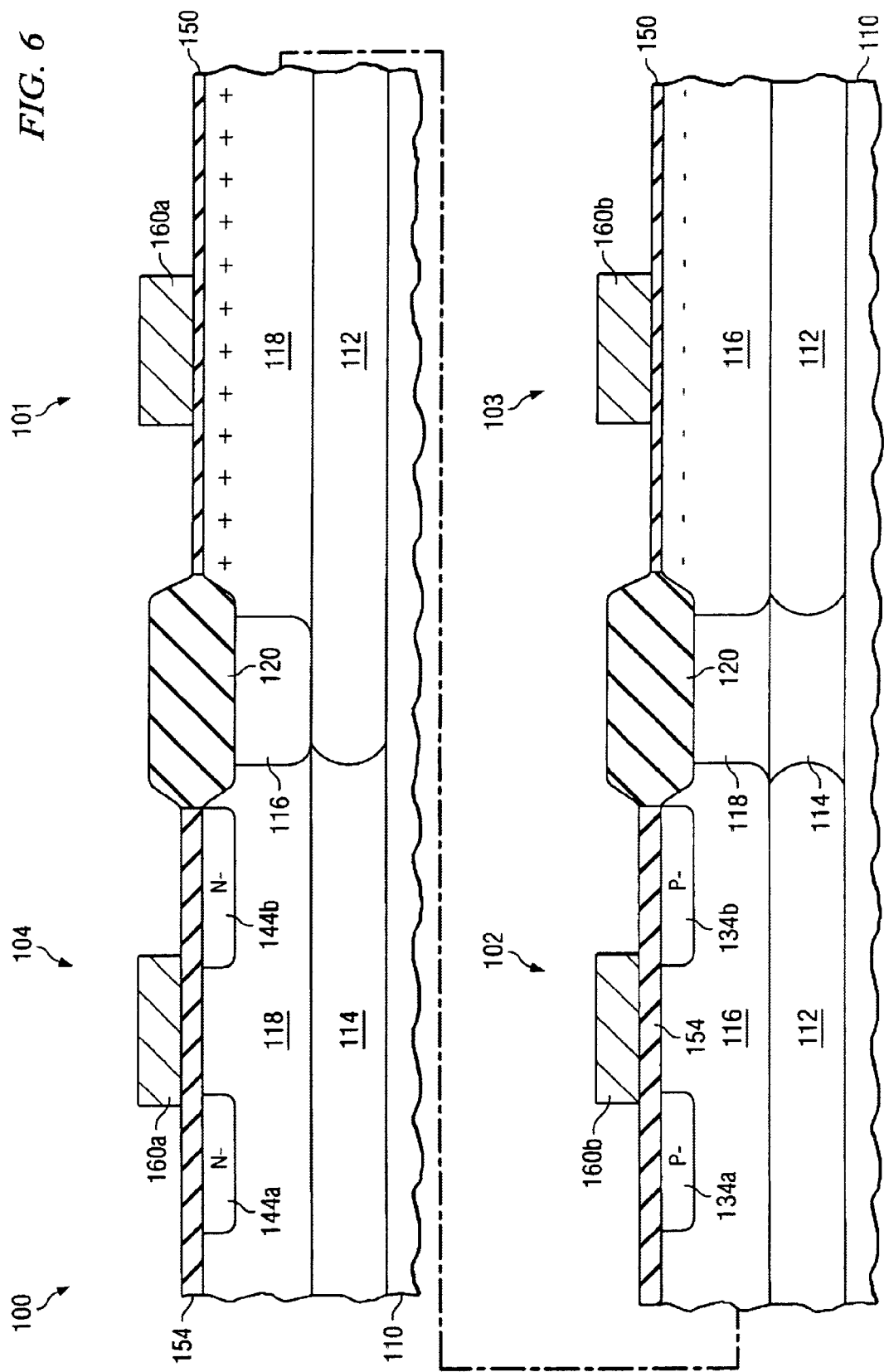

Referring now to FIGS. 5 and 6, polysilicon gate structures are then formed in the semiconductor device 100. In FIG. 5, a polysilicon layer 160 is deposited over the gate oxide layers 150, 154 and the field oxide structures 120. A resist mask 162 is then formed over the second and third transistor regions 102 and 103, respectively, (e.g., leaving the polysilicon 160 overlying the first and fourth regions 101 and 104 exposed) and a phosphorus implantation 164 is performed to provide N doped polysilicon over the first and fourth regions 101 and 104, leaving undoped polysilicon over the second and third regions 102 and 103, respectively. The mask 162 is then removed, and the polysilicon 160 is patterned using a gate mask and an etch process (not shown) to leave N doped polysilicon gate structures 160a over channel regions of the first and fourth transistor regions 101 and 104, as well as undoped polysilicon gate structures 160b over channel regions of the second and third transistor regions 102 and 103, respectively, as illustrated in FIG. 6.

Figure 7:
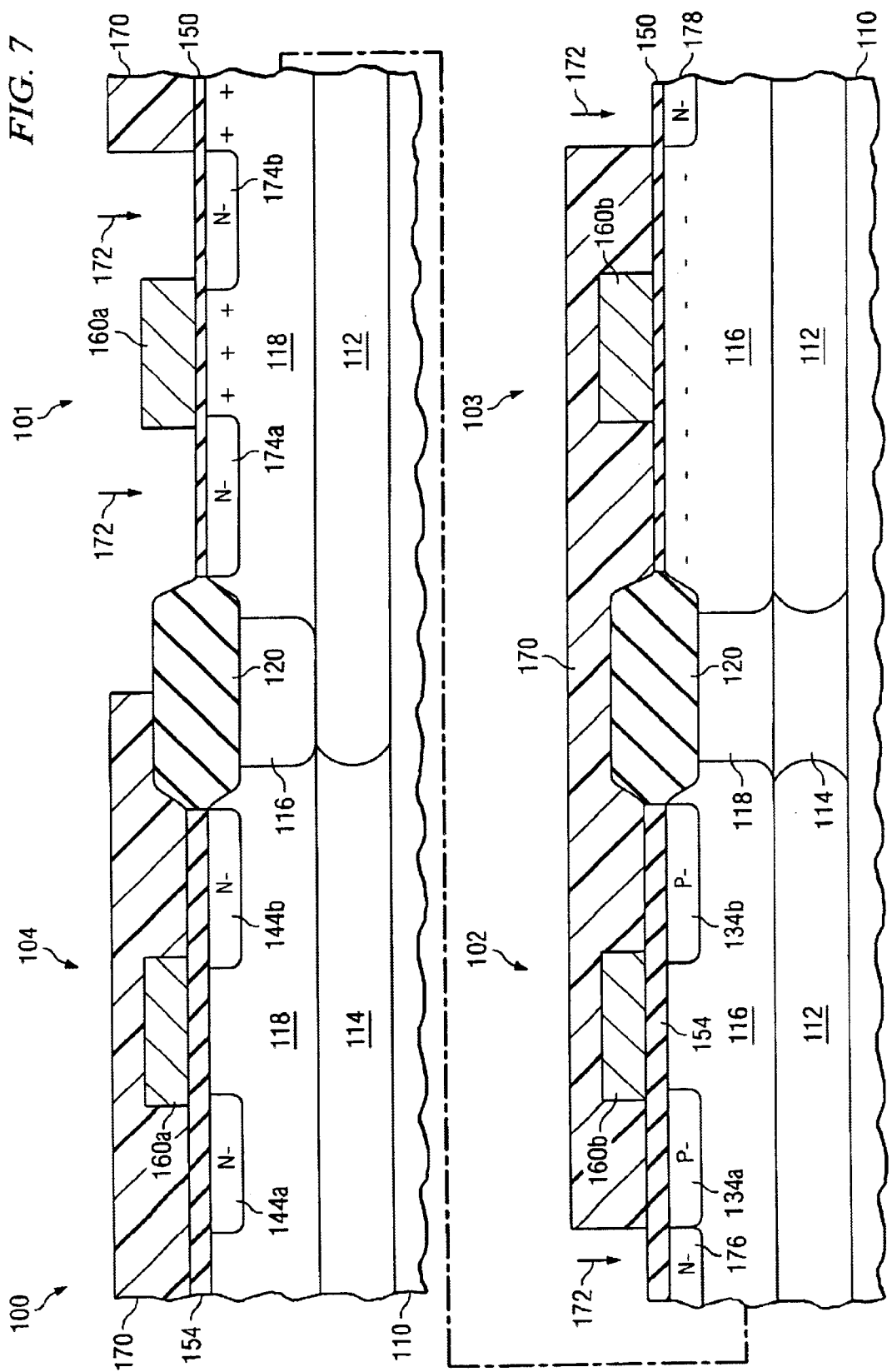
FIG. 7 is a partial side elevation view in section illustrating implantation of source/drain regions of a low voltage NMOS device using a phosphorus or arsenic LDD implantation process in the semiconductor device of FIGS. 2–6.

In FIG. 7, an NLDD mask 170 is provided overlying the fourth transistor region 104 and portions of the second and third regions 102 and 103, and exposing the first region 101 and portions of the second and third regions 102 and 103. A first LDD implantation process 172 is then performed using phosphorus or arsenic in the regions of the device 100 exposed through the mask 170. The selective implantation process 172 thus forms source/drain regions 174a and 174b in the first transistor region 101, and N⁻ doped portions 176 and 178 in the exposed portions of the second and third transistor regions 102 and 103, respectively. For example, the LDD implant 172 in the device 100 comprises performing a phosphorus LDD implantation in a portion of the first transistor region 101 using a dose of about 4 E13 cm⁻² and an energy of about 40 keV. It is noted at this point that were the LDD implant 172 employed to form the source/drain regions 144a and 144b of the high voltage NMOS device in the fourth region 104, high substrate currents and channel hot carrier degradation may result. Therefore, the NLDD mask 170 prevents the implantation in the fourth region 104.

Figure 8:
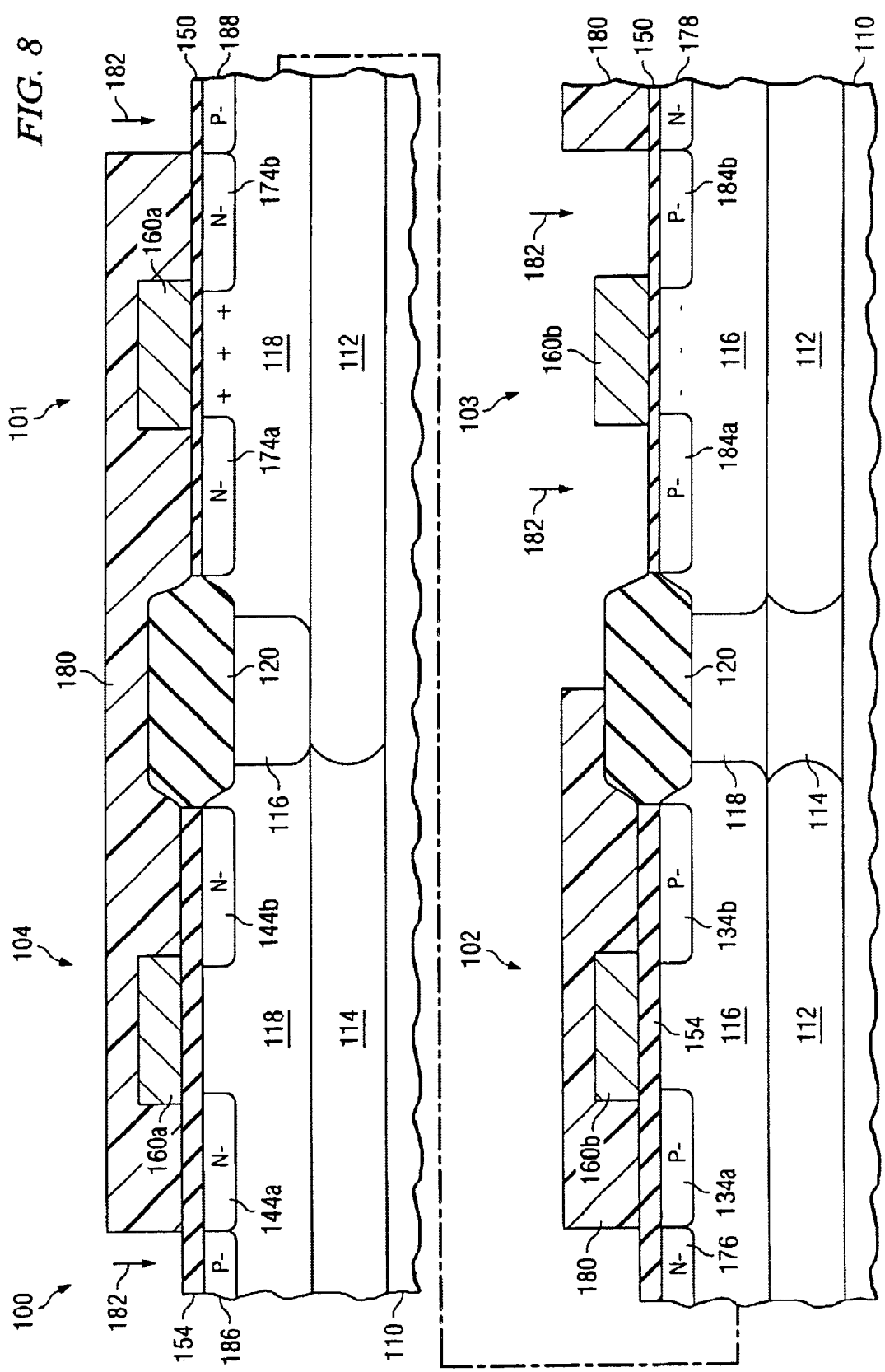
FIG. 8 is a partial side elevation view in section illustrating implantation of source/drain regions of a low voltage PMOS device using a boron LDD implantation process in the semiconductor device of FIGS. 2–7.

As illustrated in FIG. 8, a PLDD mask 180 is then formed over the second transistor region 102 and portions of the first and fourth regions 101 and 104, leaving the third transistor region 103 (e.g., as well as portions of the first and fourth transistor regions 101 and 104, respectively) exposed. A second LDD implantation process 182 is then performed using boron in the exposed regions of the device 100. The process 182 provides for formation of source/drain regions 184a and 184b in the third transistor region 103, as well as P⁻ doped portions 186 and 188 in the exposed portions of the first and fourth transistor regions 101 and 104, respectively. In this regard, any appropriate LDD implant may be used, for example, where the illustrated process 182 comprises a boron LDD implantation in a portion of the third transistor region 103 using a dose of about 4 E13 cm⁻² and an energy of about 20 keV.

Figure 9:
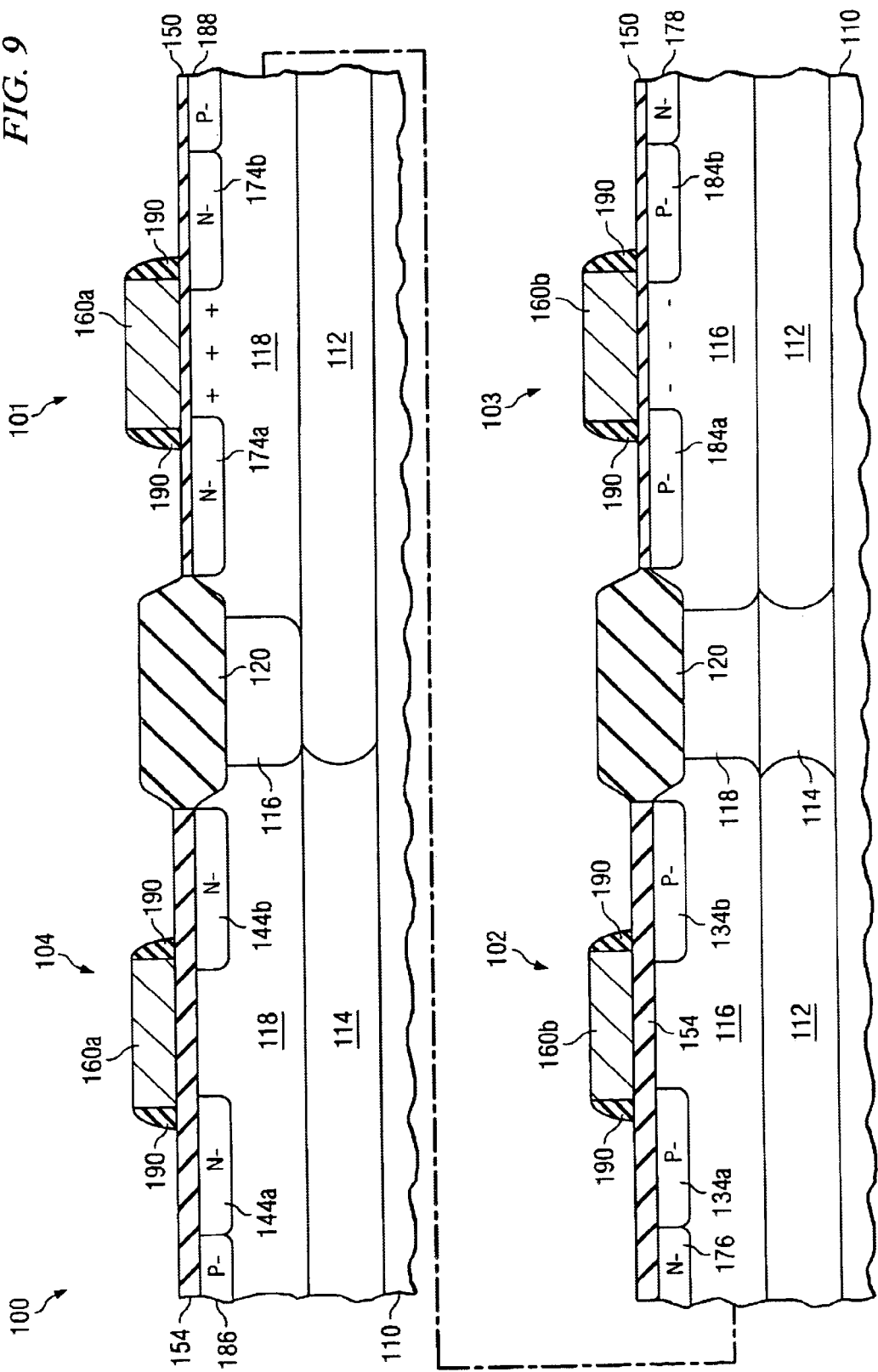
FIG. 9 is a partial side elevation view in section illustrating formation of sidewall spacers in the semiconductor device of FIGS. 2–8.

Sidewall spacers 190 are then formed along the sidewalls of the polysilicon gate structures 160a and 160b in the regions 101–104, as illustrated in FIG. 9. Referring also to FIG. 10, a mask 200 is formed (e.g., using photoresist deposition and appropriate photolithography steps), thus shielding most of the second and third regions 102 and 103, respectively, and a phosphorus and/or arsenic implantation process 202 is performed. In one implementation, the implant 202 comprises implanting phosphorus using a dose of about 4 E12 cm⁻² and an energy of about 50 keV and thereafter implanting arsenic using a dose of about 3 E15 cm⁻² and an energy of about 120 keV in order to further form and extend the NMOS source/drain regions 144 and 174 in the first and fourth regions 101 and 104, as well as the regions 176 and 178 in the exposed portions of the second and third regions 102 and 103, respectively. Thereafter, as illustrated in FIG. 11, a mask 210 is formed and a boron implantation process 212 is performed, in order to further form and extend the PMOS source/drain regions 134 and 184 in the second and third regions 102 and 103, as well as the outlying regions 186 and 188 in the first and fourth regions 101 and 104, respectively.

Thereafter, further back-end processing (not shown) is performed on the semiconductor device 100 in order to complete fabrication of the transistors in the regions 101–104, as well as other devices (e.g., capacitors, resistors, and the like). For instance, overlying insulation and metal connection layers may be formed to interconnect the various devices and to provide external connection pads thereto. It is noted at this point that although illustrated and described above in the context of semiconductor devices (e.g., device 100) having MOSFET transistor devices of two different gate oxide thicknesses, including both NMOS and PMOS MOSFETs of each oxide thickness, that the various aspects of the present invention are applicable to many other configurations of semiconductor devices. For example, the invention may be employed to reduce processing steps required to manufacture products having three or more types of transistors, where each type has a unique gate oxide thickness associated therewith.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating MOSFET transistors in a semiconductor device, comprising the steps of:
   providing a semiconductor device substrate;
   implanting a first transistor region associated with a first transistor device in the semiconductor device substrate to adjust a threshold voltage associated with the first transistor device and concurrently implanting a portion of a second transistor region in the semiconductor device substrate associated with a second transistor device in the semiconductor device to form source/drain regions associated with the second transistor device with a channel region between said source/drain regions;
   then forming a first gate oxide structure overlying a channel region in the first transistor region, the first gate oxide structure having a first thickness and forming a second gate oxide structure overlying the channel region in the second transistor region, the second gate oxide structure having a second thickness, the second thickness being greater than the first thickness.

2. The method of claim 1, further comprising the step of then implanting a portion of the first transistor region to form source/drain regions associated with the first transistor device.

3. The method of claim 2, further comprising the steps of then implanting a third transistor region associated with a third transistor device in the semiconductor device using a third implantation process to adjust a threshold voltage associated with the third transistor device and concurrently implanting a portion of a fourth transistor region in the semiconductor device substrate associated with a fourth transistor device in the semiconductor device to form source/drain regions associated with the fourth transistor device with a channel region between said source/drain regions;

then forming a third gate oxide structure overlying a channel region in the third transistor region, the third gate oxide structure having a third thickness and forming a fourth gate oxide structure overlying the channel region in the fourth transistor region, the fourth gate oxide structure having a fourth thickness, the fourth thickness being greater than the third thickness.

4. The method of claim 3, further comprising the step of implanting a portion of the third transistor region to form a source/drain region associated with the third transistor device.

5. The method of claim 3, wherein the first and third transistor devices comprise a first one of an NMOS transistor and a PMOS transistor, and wherein the second and fourth transistor devices comprise a second one of an NMOS transistor and a PMOS transistor.

6. The method of claim 3, wherein the first and third transistor devices comprise NMOS transistors, wherein the second and fourth transistor devices comprise PMOS transistors, and wherein implanting the third transistor region and a portion of the fourth transistor region comprises implanting phosphorus in the third transistor region and a portion of the fourth transistor region.

7. The method of claim 6, wherein implanting phosphorus in the third transistor region and a portion of the fourth transistor region comprises the steps of:

performing a phosphorus threshold adjustment implantation in the third transistor region and a portion of the fourth transistor region using a dose of about 8 E11 $cm^{-2}$ and an energy of about 20 keV; and performing a phosphorus punch-through implantation in the third transistor region and a portion of the fourth transistor region using a dose of about 2 E12 $cm^{-2}$ and an energy of about 70 keV.

8. The method of claim 4, wherein the first and third transistor devices comprise NMOS transistors, wherein the second and fourth transistor devices comprise PMOS transistors, and wherein implanting a portion of the third transistor region using the fourth implantation process comprises implanting boron in a portion of the fourth transistor region.

9. The method of claim 8, wherein implanting boron in a portion of the fourth transistor region comprises:

performing a boron LDD implantation in a portion of the fourth transistor region using a dose of about 4 E13 $cm^{-2}$ and an energy of about 20 keV.

10. The method of claim 2, wherein the first transistor device comprises an NMOS transistor, wherein the second transistor device comprises a PMOS transistor, and wherein implanting a portion of the first transistor region comprises implanting at least one of phosphorus and arsenic in a portion of the first transistor region.

11. The method of claim 10, wherein implanting at least one of phosphorus and arsenic in a portion of the first transistor region comprises performing a phosphorus LDD implantation in a portion of the first transistor region using a dose of about 4 E13 $cm^{-2}$ and an energy of about 40 keV.

12. The method of claim 1, wherein the first transistor device comprises an NMOS transistor, wherein the second transistor device comprises a PMOS transistor, and wherein implanting the first transistor region and a portion of the second transistor region comprises implanting boron in the first transistor region and a portion of the second transistor region.

13. The method of claim 12, wherein implanting boron in the first transistor region and a portion of the second transistor region comprises the steps of:

performing a boron threshold adjustment implantation in the first transistor region and a portion of the second transistor region using a dose of about 3 E12 $cm^{-2}$ and an energy of about 20 keV; and performing a boron punch-through implantation in the first transistor region and a portion of the second transistor region using a dose of about 4 E12 $cm^{-2}$ and an energy of about 70 keV.

14. The method of claim 1, wherein the first thickness is about 65 Å or more and the second thickness is about 300 Å or less.

15. The method of claim 14, wherein the first thickness is about 75 Å and the second thickness is about 200 Å.

16. The method of claim 1, wherein first transistor device comprises a PMOS transistor, wherein the second transistor device comprises an NMOS transistor, and wherein implanting the first transistor region and a portion of the second transistor region comprises implanting phosphorus in the first transistor region and a portion of the second transistor region.

17. The method of claim 16, wherein implanting phosphorus in the first transistor region and a portion of the second transistor region comprises the steps of:

performing a phosphorus threshold adjustment implantation in the first transistor region and a portion of the second transistor region using a dose of about 8 E11 $cm^{-2}$ and an energy of about 20 key; and performing a phosphorus punch-through implantation in the first transistor region and a portion of the second transistor region using a dose of about 2 E12 $cm^{-2}$ and an energy of about 70 keV.

18. A method of fabricating MOSFET transistors in a semiconductor device, comprising the steps of:

providing a semiconductor substrate;

adjusting the threshold voltage of a first transistor relatively low voltage device in a first region of said semiconductor device substrate; and concurrently with said step of adjusting, forming a source/drain region of a second transistor relatively high voltage device, both using the same implant.

19. The method of claim 18, further comprising the step of forming a source/drain region of the first transistor device.

20. A method of fabricating MOSFET transistors in a semiconductor device, comprising the steps of:

providing a semiconductor substrate;

adjusting a threshold voltage of a first transistor relatively low voltage device in a first region of said semiconductor device substrate;

concurrently with said step of adjusting, forming a source/drain region of a second transistor relatively high voltage device, both using the same implant;

forming a source/drain region of the first transistor device;

then forming a first gate oxide structure of the first transistor device having a first thickness; and forming a second gate oxide structure of the second transistor device having a second thickness, the second thickness being greater than the first thickness.

21. A method of fabricating MOSFET transistors in a semiconductor device, comprising the steps of:

providing a semiconductor substrate;

adjusting a threshold voltage of a first transistor relatively low voltage device in a first region of said semiconductor device substrate;

concurrently with said step of adjusting, forming a source/drain region of a second transistor relatively high voltage device, both using the same implant;

forming a source/drain region of the first transistor device; and then adjusting a threshold voltage of a third transistor device and forming a source/drain region of a fourth transistor device.

22. The method of claim 21, further comprising the steps of forming a source/drain region of the third transistor device.

23. The method of claim 22, wherein the first and third transistor devices comprise a first one of NMOS transistors and PMOS transistors, and wherein the second and fourth transistors comprise a second one of NMOS transistors and PMOS transistors.

24. A method of fabricating MOSFET transistors in a semiconductor device, comprising the steps of:

providing a semiconductor substrate;

adjusting a threshold voltage of a first transistor relatively low voltage device in a first region of said semiconductor device substrate; and concurrently with said step of adjusting, forming a source/drain region of a second transistor relatively high voltage device, both using the same implant;

wherein the first transistor device comprises an NMOS transistor, wherein the second transistor device comprises a PMOS transistor, and wherein adjusting a threshold voltage of the first transistor device and forming a source/drain region of the second transistor device comprises selectively implanting a first transistor region associated with the first transistor device to adjust a threshold voltage associated with the first transistor device, and implanting a portion of a second transistor region associated with the second transistor device to form a source/drain region associated with the second transistor device using boron.

25. A method of fabricating MOSFET transistors in a semiconductor device, comprising the steps of:

providing a semiconductor substrate;

adjusting a threshold voltage of a first transistor relatively low voltage device in a first region of said semiconductor device substrate; and concurrently with said step of adjusting, forming a source/drain region of a second transistor relatively high voltage device, both using the same implant;

wherein the first transistor device comprises a PMOS transistor, wherein the second transistor device comprises an NMOS transistor, and wherein adjusting a threshold voltage of the first transistor device and forming a source/drain region of the second transistor device comprises selectively implanting a first transistor region associated with the first transistor device to adjust a threshold voltage associated with the first transistor device, and implanting a portion of a second transistor region associated with the second transistor device to form a source/drain region associated with the second transistor device using phosphorus.

26. A method of forming a source/drain region in a semiconductor device, comprising the steps of:

providing a semiconductor device substrate; and selectively concurrently implanting a first relatively low voltage transistor region in said semiconductor device substrate to adjust the threshold voltage associated with a first transistor device and implanting a portion of a second transistor region to form a source/drain region associated with a second relatively high voltage transistor device.

27. The method of claim 26, wherein selectively implanting the first transistor region and a portion of the second transistor region comprises the step of implanting one of phosphorus, arsenic and boron in the first transistor region and a portion of the second transistor region.

28. A method of fabricating a semiconductor device, comprising the steps of providing a semiconductor device substrate;

concurrently implanting in said semiconductor device substrate an active region of a low voltage NMOS device and source/drain regions of a high voltage PMOS device using a boron threshold voltage adjust implantation;

implanting an active region of a low voltage PMOS device and source/drain regions of a high voltage NMOS device using a phosphorus threshold voltage adjust implantation process;

forming polysilicon gate structures associated with the high and low voltage NMOS and PMOS devices;

implanting source/drain regions associated with the low voltage NMOS device using a phosphorus or arsenic LDD implantation; and implanting source/drain regions associated with the low voltage PMOS device using a boron LDD implantation.

29. The method of claim 28, further comprising the steps of:

forming sidewall spacers on opposite sides of the polysilicon gate structures;

further implanting the source/drain regions associated with the low and high voltage NMOS devices using a phosphorus or arsenic implantation; and further implanting the source/drain regions associated with the low and high voltage PMOS devices using a boron implantation.

30. The method of claim 29, further comprising the steps of:

forming a first gate oxide layer having a first thickness overlying the active regions associated with the low voltage NMOS and PMOS devices; and forming a second gate oxide layer having a second thickness overlying the active regions associated with high voltage NMOS and PMOS devices, wherein the second thickness is greater than the first thickness.

* * * * *